United States Patent
Biesterfeldt

(10) Patent No.: US 7,019,551 B1
(45) Date of Patent: Mar. 28, 2006

(54) OUTPUT BUFFER WITH SLEW RATE CONTROL AND A SELECTION CIRCUIT

(75) Inventor: Randall Paul Biesterfeldt, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 10/261,109

(22) Filed: Sep. 30, 2002

Related U.S. Application Data

(60) Provisional application No. 60/344,163, filed on Dec. 27, 2001.

(51) Int. Cl.
*H03K 19/003* (2006.01)
(52) U.S. Cl. .......................................... 326/29; 326/27
(58) Field of Classification Search ................. 326/29, 326/17, 26–27, 31, 34; 327/170
See application file for complete search history.

(56) References Cited

U.S. PATENT DOCUMENTS

| | | | | |
|---|---|---|---|---|
| 4,622,482 A | * | 11/1986 | Ganger | 327/410 |
| 5,218,239 A | * | 6/1993 | Boomer | 326/27 |
| 6,236,248 B1 | * | 5/2001 | Koga | 327/112 |

* cited by examiner

*Primary Examiner*—James H. Cho
(74) *Attorney, Agent, or Firm*—Williams, Morgan & Amerson

(57) ABSTRACT

An output buffer having a controlled output slew rate comprises a first predriver circuit having a first RC circuit and a first output node and a second predriver circuit having a second RC circuit and a second output node. A buffer input node is coupled to the first and second predriver circuits. The output buffer further includes an output circuit having first and second input nodes and a third output node, where the first and second input nodes are coupled, respectively, to the first and second output nodes. The time constants of the RC circuits control a signal slew rate at the third output node of the output circuit, and the value of R may be selected to provide a predetermined, controlled slew rate range at the third output node. A selection circuit aids in the selection of an appropriate value for R.

18 Claims, 6 Drawing Sheets

OUTPUT BUFFER WITH SLEW RATE CONTROL AND A SELECTION CIRCUIT

SPECIFIC REFERENCE TO PROVISIONAL APPLICATION

The present application claims priority to provisional application Ser. No. 60/344,163, filed Dec. 27, 2001, the entire text and figures of which are incorporated herein by reference without disclaimer.

BACKGROUND OF THE INVENTION

1. Field of the Invention

The present invention is generally directed to the field of integrated circuits, and, more particularly, to an integrated circuit having an output buffer with slew rate control and a selection circuit for producing a desired slew rate in the output buffer.

2. Description of the Related Art

Integrated circuit devices have become quite commonplace in the modern world. A modern computer system may include hundreds, if not thousands, of integrated circuit devices. Over the years, the individual integrated circuit devices themselves have become extremely complex, and their interaction with one another, for example in a modern computer system, has also become much more complex. The timing of various signals between integrated circuit devices in a computer system, for example, is now much more critical than in early computer systems. Standards have been promulgated to govern the timing of signals between integrated circuit devices. Various bus architectures used in personal computers, for example, have specifications controlling the timing of various signals as well as the speed with which various signals must become "valid." As an example, some bus specifications require that a signal become "valid" within a specified period of time following a triggering event.

To meet such timing requirements, many integrated circuits that provide output signals employ some form of "slew rate" control. "Slew rate" is the rate at which an output voltage, for example, transitions from a "low" value to a "high" value, or from a "high" value to a "low" value. Some devices have attempted to control the slew rate by restricting the range of process variables, voltage and temperature. Other devices attempt to control the slew rate by turning on the output signal in stages. That is, an output signal from a particular integrated circuit device may be driven by two or more output stages, and the two or more stages will be turned on in sequence to control the slew rate. Many Universal Serial Bus drivers use a capacitive feedback from the output to the predriver stage. These devices attempt to use the gain of the output stage to make the capacitance at the predriver node appear to be very large. In essence, this technique attempts to desensitize the output driver to variations in the output capacitance, allowing greater variation of the output capacitance without undue effect on the slew rate.

However, variation in the output capacitance is not the only factor that affects the slew rate. Variations in manufacturing process parameters, voltage levels in the integrated circuit device and temperature at which the device is operating all contribute to variations in the slew rate at the output stage. In particular, in light of the many factors affecting slew rate, as the load capacitance and process being driven by the output circuit varies through a permitted range, the slew rate of the output signal may fall outside the range required by an applicable specification.

The present invention is directed to solving, or at least reducing, some or all of the aforementioned problems.

SUMMARY OF THE INVENTION

In one aspect of the present invention, an output buffer comprises a predriver circuit having first and second transistors and an RC circuit, the RC circuit being coupled between the first and second transistors. The output buffer further comprises an output circuit coupled to the predriver circuit, the output circuit having an input node and an output node, the output node including a capacitor coupled between the input node and the output node. The RC circuit is selected to provide a controlled signal slew rate at the output node of the output circuit.

In another aspect of the present invention, a selection circuit comprises a first integrating stage having a first comparator coupled to a first delay circuit, the first integrating stage having an input node and a first output node. The selection circuit further comprises a second integrating stage having a second comparator coupled to a second delay circuit, the second integrating stage having an input node and a second output node. The selection circuit includes an input node coupled to the input nodes of the first and second integrating stages and a time reference node coupled to the first and second comparators.

BRIEF DESCRIPTION OF THE DRAWINGS

The invention may be understood by reference to the following description taken in conjunction with the accompanying drawings, in which like reference numerals identify like elements, and in which.

Figure 1:
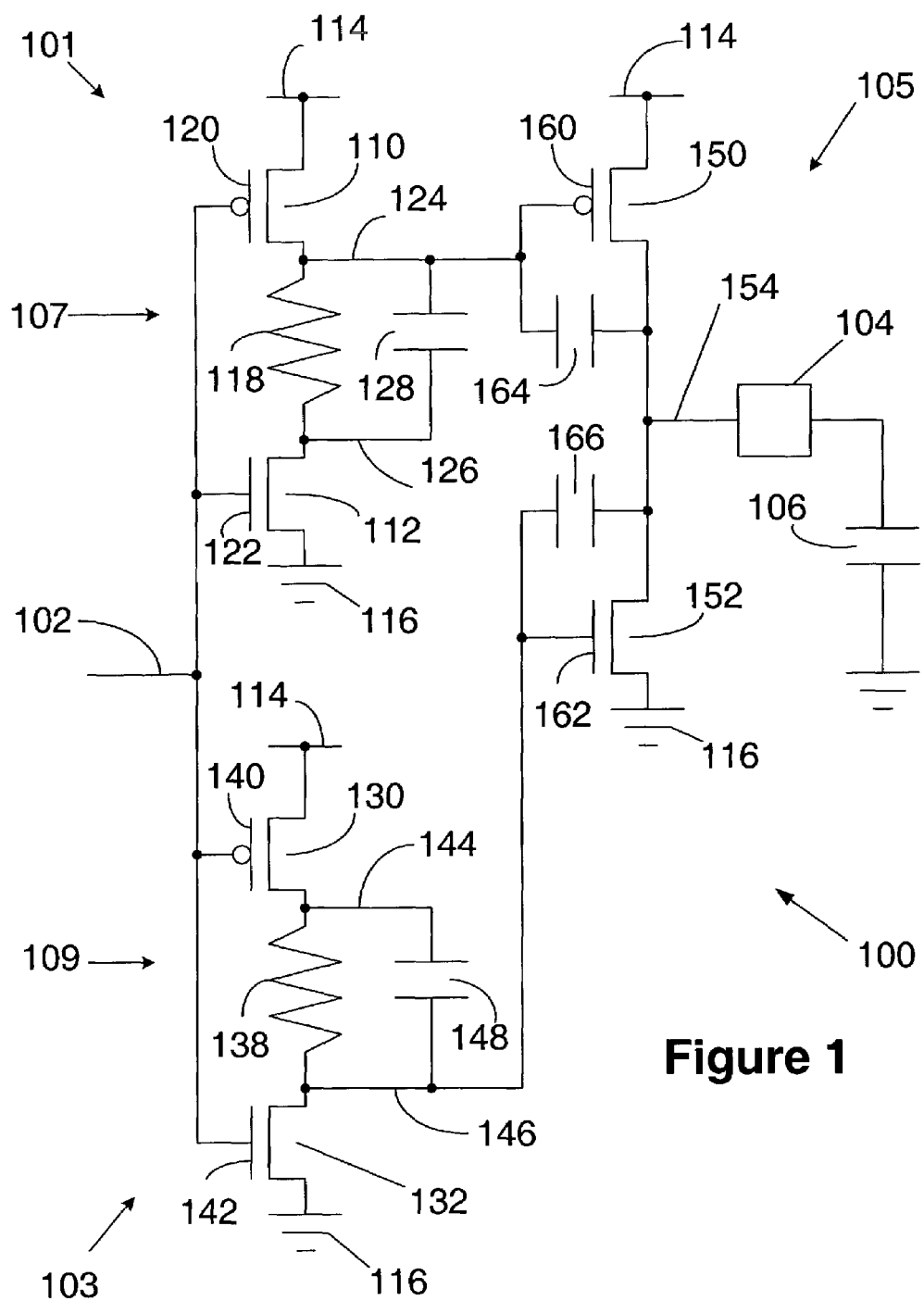
FIG. 1 depicts one illustrative embodiment of the inventive output buffer disclosed herein.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to FIGS. 1, 2A–2D and 3A–3B. In the illustrative example shown in FIGS. 1 and 2A–2D, CMOS circuitry is employed. However, as will be readily apparent to those skilled in the art upon a complete reading of the present application, the present invention may be realized utilizing a variety of technologies, for example, NMOS, PMOS, CMOS, etc. Moreover, the present invention may be used in a variety of integrated circuit devices that supply an output signal, including, but not limited to, logic devices, memory devices, etc.

FIG. 1 depicts one illustrative embodiment of an output buffer utilizing aspects of the present invention. The output buffer 100 includes a first predriver circuit 101 and a second predriver circuit 103. In addition, the output buffer 100 includes an output circuit 105. The output buffer 100 receives a signal at an input node 102 and provides an output signal at an output node 154. The output node 154 may be coupled to an output pad 104, for example, of a packaged integrated circuit device. The output pad 104 will typically be coupled to a capacitive load 106 that will receive the output signal from the output buffer 100. While the illustrative embodiment employs first and second predriver circuits 101, 103, it will become apparent to a person of ordinary skill upon a complete reading of this disclosure that a single predriver circuit may be employed or multiple predriver circuits may be used.

The first predriver circuit 101 includes a first transistor 110 and a second transistor 112 coupled in series between a first power supply node 114 and a second power supply node 116. The first transistor 110 in the illustrative embodiment is a P-channel transistor, while the second transistor 112 is an N-channel transistor. As a person of ordinary skill in the art will appreciate upon a complete reading of this disclosure, the illustrative embodiment of FIG. 1 is a CMOS implementation of the present invention. The first power supply node 114 in the illustrative embodiment may be coupled to a positive power supply potential of approximately 3.0 volts DC, while the second power supply node 116 may be coupled to an electrical ground potential.

Coupled between the first transistor 110 and the second transistor 112 is an RC circuit 107. A resistor 118 is coupled in parallel to a capacitor 128 between a node 124 of the first transistor 110 and a node 126 of the second transistor 112. Thus, the RC circuit 107 is coupled in series with the first transistor 110 and the second transistor 112 between the first power supply node 114 and the second power supply 116. A gate terminal 120 of the first transistor 110 and a gate terminal 122 of the second transistor 112 are each coupled to the input node 102. The node 124 is coupled to the output circuit 105, as will be more fully explained below.

The second predriver circuit 103 includes a first transistor 130 and a second transistor 132 coupled in series between the first power supply node 114 and the second power supply node 116. In the illustrative embodiment of FIG. 1, the transistor 130 is a P-channel transistor, and the second transistor 132 is an N-channel transistor. A gate terminal 140 of the first transistor 130 and a gate terminal 142 of the second transistor 132 are each coupled to the input node 102. An RC circuit 109 is coupled in series between the first transistor 130 and the second transistor 132. Thus, the first transistor 130, the RC circuit 109 and the second transistor 132 are coupled in series between the first power supply node 114 and the second power supply node 116. The RC circuit 109 includes a resistor 138 and a capacitor 148 coupled in series between a node 144 of the first transistor 130 and a node 146 of the second transistor 132. The node 146 is coupled to the output circuit 105 as will be explained further below.

The output circuit 105 comprises a first transistor 150 coupled in series with a second transistor 152 between the first power supply node 114 and the second power supply node 116. In the illustrative embodiment of FIG. 1, the first transistor 150 is a P-channel transistor, and the second transistor 152 is an N-channel transistor. The output node 154 is a common node between the first transistor 150 and the second transistor 152. A gate terminal 160 of the first transistor 150 is coupled to the node 124 of the first predriver circuit 101. A gate terminal 162 of the second transistor 152 is coupled to the node 146 of the second predriver circuit 103. A capacitor 164 is coupled between the gate terminal 160 of the first transistor 150 and the output node 154. Another capacitor 166 is coupled between the gate terminal 162 of the second transistor 152 and the output node 154. Table 1 sets forth the approximate sizes and values of the various components of the illustrative circuit of FIG. 1.

TABLE 1

| Component(s) Number | Approximate Size/Value |
| --- | --- |
| 110 | w = 40 μm, 1 = 0.35 μm |
| 112, 130, 132 | w = 10 μm, 1 = 0.35 μm |
| 118 | 1200 ohms |
| 138 | 1800 ohms |
| 128 | 600 fF |
| 148 | 500 fF |
| 164 | 300 fF |
| 166 | 400 fF |
| 150 | w/l = 700/0.5 |
| 152 | w/l = 430/1 |

Briefly, the output buffer 100 operates as follows: each of the predriver circuits 101, 103 performs an inverter function, with their respective outputs 124, 146 being a logical inverse of their input 102. Thus, as an input signal at node 102 transitions from low to high, the output signals at nodes 124, 146 will transition from high to low, and vice versa. The values of the resistors 118, 138 and capacitors 128, 148 will affect the rates at which the output signals at nodes 124, 146 will transition from high to low and from low to high. As the output signals at nodes 124, 146 transition from high to low, the output signal at the node 154 will transition from low to high. The values of the capacitors 164, 166, together with the value of the capacitive load 106, will affect the rate at which the output signal at the node 154 will transition from low to high and from high to low. Also, the rates at which the output signals at the nodes 124, 146 transition will affect the rate at which the output signal at the node 154 will transition.

For example, the function of the capacitor 128 may be understood by first considering the upper portion of the circuit of FIG. 1 assuming, for illustrative purposes, that the capacitor 128 is absent. For a low-to-high transition, the total capacitance on the node 124 is discharged through the resistor 118 and the transistor 112. The voltage on node 124, $V_{124}(t)$, follows $V_{124}(t)=3.3*(1-e^{-t/\tau})$, where $\tau=R^{118}*C^{eff,124}$. When the voltage on the node 124 is discharged sufficiently to turn on the transistor 160, the voltage on the node 154 begins to rise. The discharge current, limited by the resistor 118, sees a larger effective capacitance at 164 ($C_{eff,164}=(1-A_v)C_{164}$), slowing the discharge rate of the voltage at node 124 and creating a voltage plateau. The relatively constant current through resistor 118 creates a linear voltage ramp at node 154 ($I=dV/dt=V_{plateau}/R_{118}$). In the illustrated embodiment, however, the capacitor 128 is present and thus provides a feed-forward or voltage-divider path from the node 124 to node 126. This reduces the delay from waiting for the voltage at node 124 to discharge to the threshold of transistor 160.

For a given value of RC in the predriver circuits 101, 103, the output slew rate can be controlled within a range as the value of the capacitive load 106 varies. Thus, by selecting appropriate values for the resistors 118, 138 and the capacitors 128, 148, the output slew rate can be controlled within a desired range as the value of the capacitive load 106 varies over a specified range. In certain applications of the present invention, the specified range over which the capacitive load 106 may vary is from approximately 15 pf to approximately 40 pf, or a range of about 2.67:1. In those applications, it is desirable to control the output slew rate to a range from approximately 0.4 volts/ns to approximately 1.0 volts/ns, or a range of about 2.5:1. Utilizing the present invention, this goal may be achieved.

Due to variations inherent in typical semiconductor manufacturing processes, the values of many of the components described above will vary. For example, in the illustrative output buffer 100 of FIG. 1, the values of the resistors 118, 138 and the capacitors 128, 148, and therefore the RC product, will normally vary from chip to chip. To allow a wider process range for R and C, the RC product may be adjusted. For example, the RC product may be adjusted by using switched resistors 118, 138. For another example, the RC product may be adjusted by using different values for the capacitors 128, 148.

FIGS. 2A–2D depict one illustrative embodiment of a selection circuit that may be used in conjunction with the output buffer 100 of FIG. 1 to determine an RC product that may produce an output slew rate that is in a desirable range. The selection circuit 200 comprises four integrating stages 201, 203, 205 and 207. Each of the integrating stages 201, 203, 205, 207 comprises a delay circuit (201A, 203A, 205A, 207A) and a comparator (201B, 203B, 205B, 207B), and each is similar in structure to the others. although the sizes of various features of certain of the devices (i.e., transistors, resistors and capacitors) vary from one stage to another as will be explained. Thus, each of the integrating stages 201, 203, 205, 207 will provide a unique time delay between a given input signal at an input terminal 222 and the respective output signal from the particular integrating stage 201, 203, 205, 207, as will be seen below.

Considering the delay circuit 201A (FIG. 2A) in the integrating stage 201, a first transistor 202, a resistor 210 and a second transistor 204 are coupled in series between a first power supply node 206 and a second power supply node 208. In the illustrative embodiment of FIG. 2A, the first transistor 202 is a P-channel transistor, and the second transistor 204 is an N-channel transistor. The first power supply node 206 in this illustrative embodiment may be coupled to a positive power supply potential of approximately 3.0 volts. The second power supply node 208 may be coupled to an electrical ground potential. A gate terminal 218 of the first transistor 202 and a gate terminal 220 of the second transistor 204 are each coupled to an input terminal 222. A capacitor 212 is coupled in parallel with the resistor 210 between a node 214 and a node 216. The transistors 202, 204, the resistor 210 and the capacitor 212 comprise a predriver circuit with a time delay between the input node 222 and the output node 214, the delay being determined, at least in part, by the RC time constant of the resistor 210/capacitor 212 combination.

Also in the delay circuit 201A, a third transistor 232 and a fourth transistor 234 are coupled in series between the first power supply node 206 and the second power supply node 208. In the illustrative embodiment of FIG. 2A, the third transistor 232 is a P-channel transistor, and the fourth transistor 234 is an N-channel transistor. A gate terminal 236 of the third transistor 232 is coupled to the node 214. A capacitor 240 is coupled between the gate terminal 236 of the third transistor 232 and the common node 242 between the third transistor 232 and the fourth transistor 234. The transistors 232, 234 and the capacitor 240 comprise an inverter circuit with capacitive feedback from the inverter output node 242 to the inverter input node 214. However, the transistors 232, 234 and the capacitor 240 need not comprise an inverter circuit, but may comprise a non-inverting circuit, for example. A fifth transistor 244 is coupled between the first power supply node 206 and the node 242. The fifth transistor 244 is connected as a capacitor, such that its drain and source terminals are coupled together and together are coupled to the first power supply node 206. A gate terminal 246 of the fifth transistor 244 is coupled to the node 242. A gate terminal 238 of the fourth transistor 234 is coupled to receive a signal from the output terminal of an inverter 230. The inverter 230 is a CMOS inverter, having a P-channel pull-up transistor and an N-channel pull-down transistor, and its input terminal is coupled to the input terminal 222.

In the comparator 201B, a differential amplifier 250 has a first input terminal coupled to the node 242 and a second input terminal coupled to receive a reference voltage from a reference voltage terminal 252. An output terminal from the differential amplifier 250 is coupled to an input node of an inverter 260. The inverter 260 is a CMOS inverter, having a P-channel pull-up transistor and an N-channel pull-down transistor, and its output node is coupled to a first output terminal 271 of the selection circuit 200.

Figure 2A:
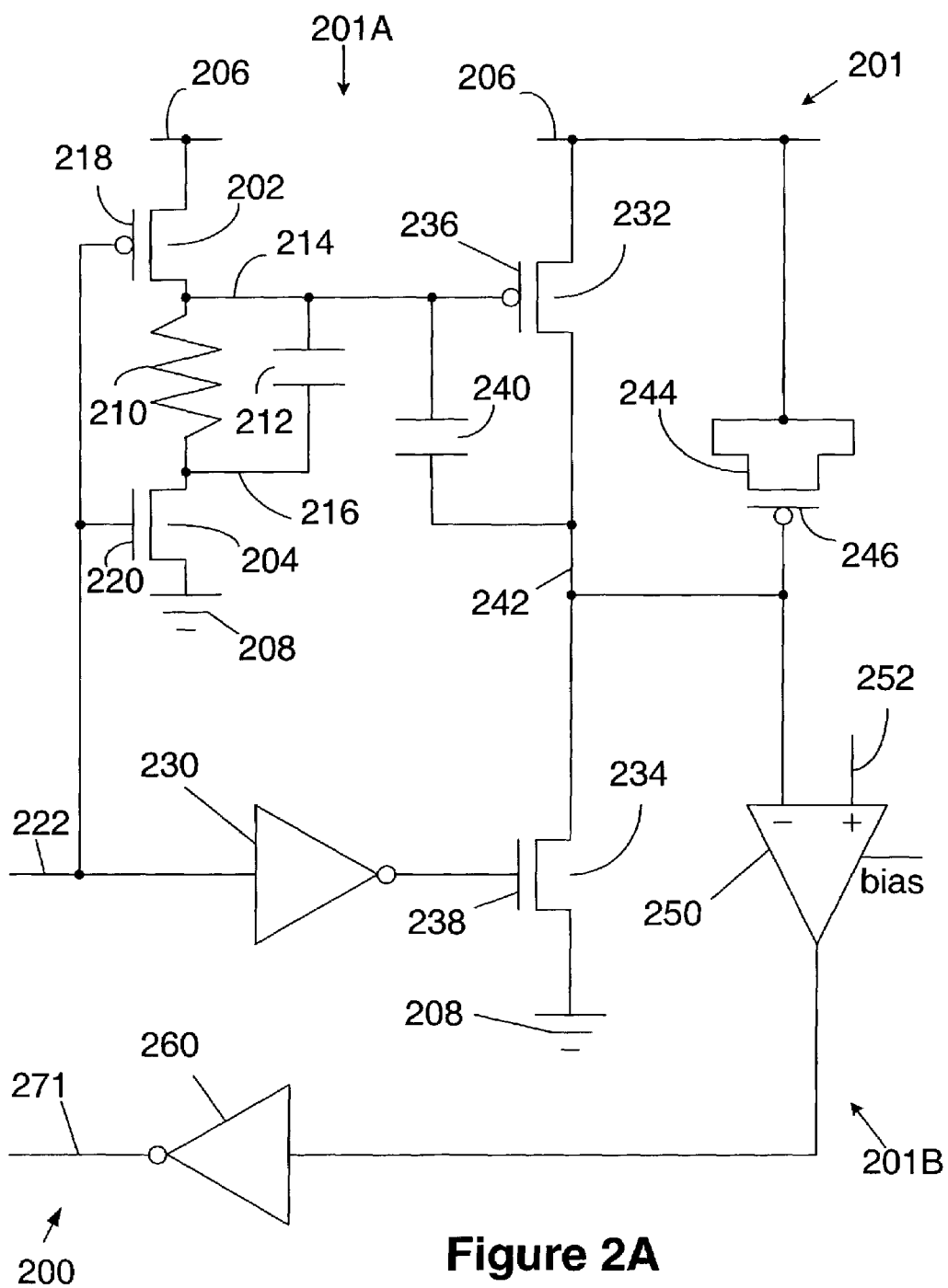
FIGS. 2A–2D depict one illustrative embodiment of a selection circuit that may be used in conjunction with the particular output buffer illustrated in FIG. 1.
Figure 2B:
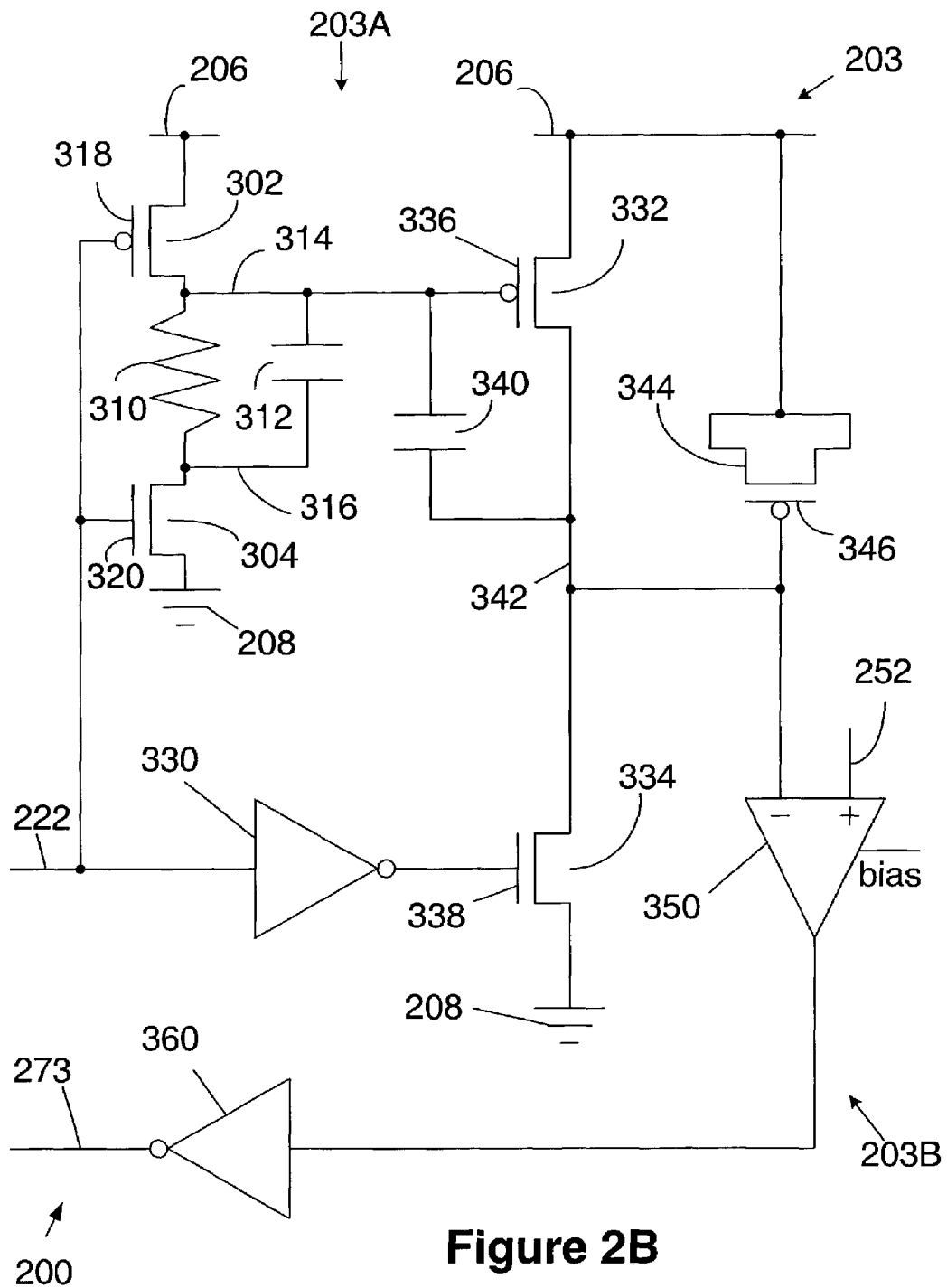
Figure 2C:
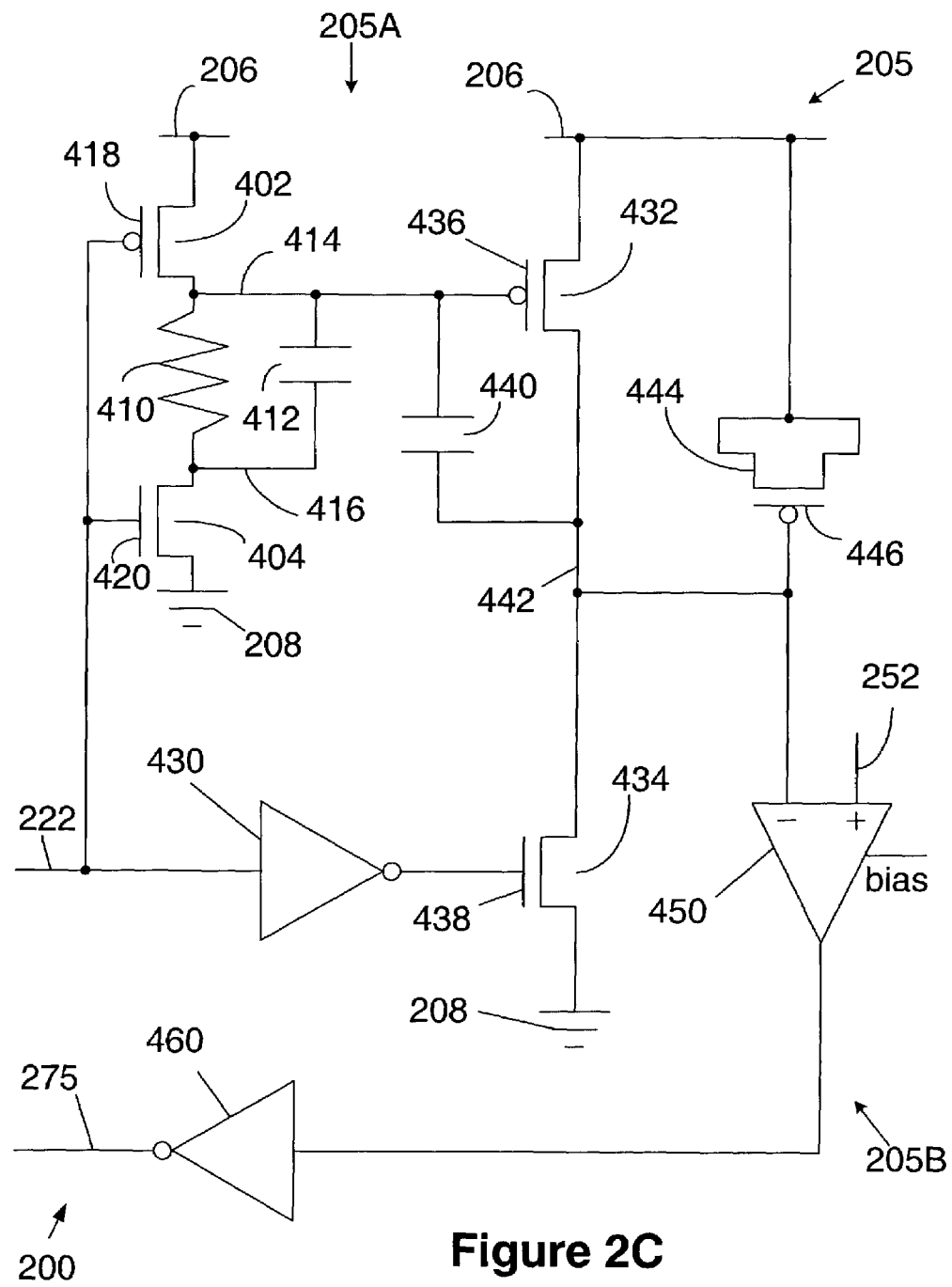
Figure 2D:
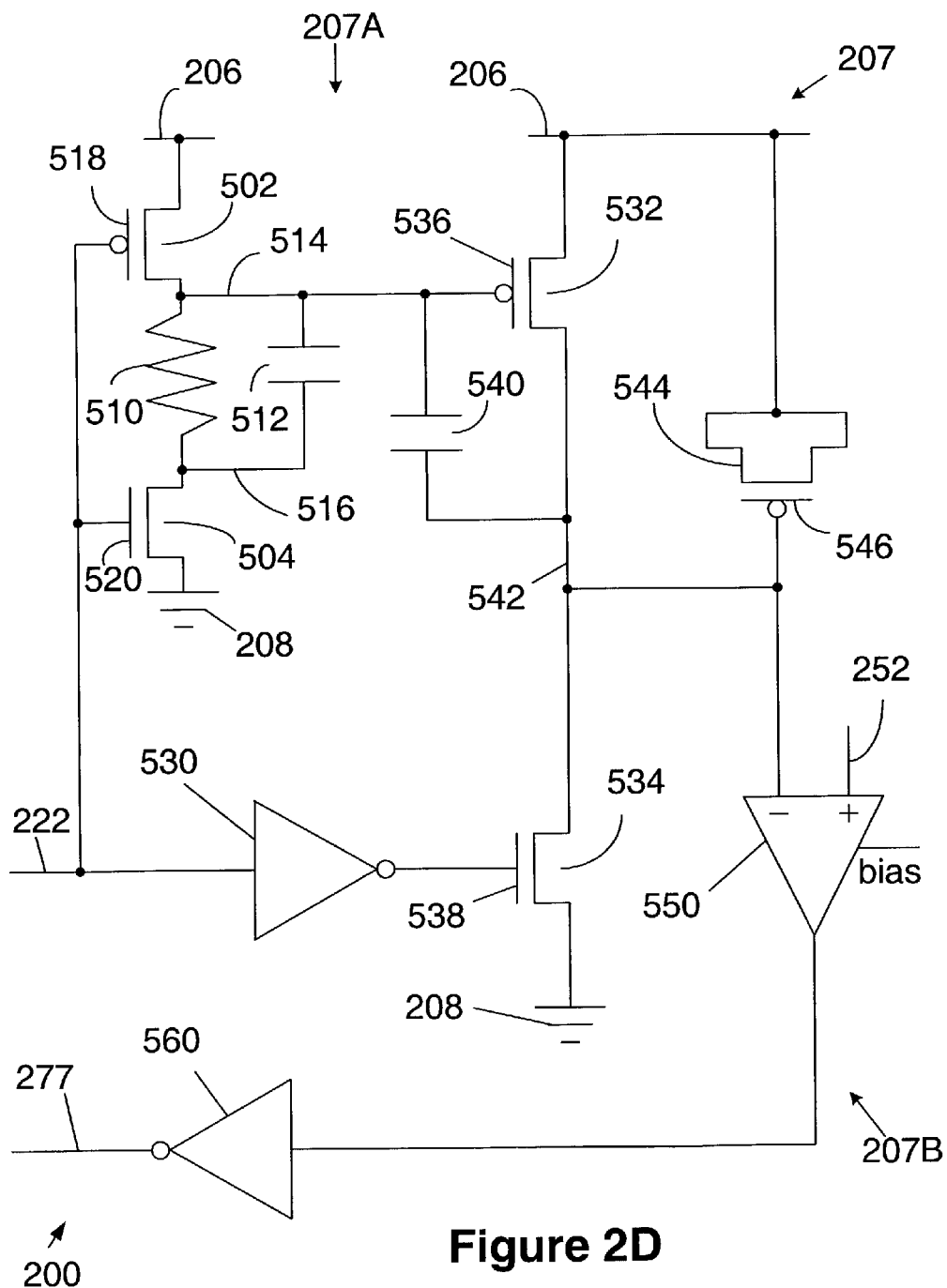

As depicted in FIGS. 2B–2D, respectively, each of the integrating stages 203, 205, 207 includes transistors, resistors, capacitors, inverters and a differential amplifier arranged and interconnected in the same manner as in the integrating stage 201 of FIG. 2A. The input terminal 222 is coupled to the integrating stages 203, 205, 207 in the manner it is coupled to the integrating stage 201. As already stated, the sizes of various features of certain of the component devices that make up each of the integrating stages 201, 203, 205, 207 differ. More particularly, in the illustrative selection circuit 200 of FIGS. 2A–2D, all corresponding transistors, capacitors and inverters in the integrating stages 201, 203, 205, 207 are of substantially the same size. For example, the transistor 202 in the integrating stage 201 and the corresponding transistors 302, 402, 502 in the integrating stages 203, 205, 207, respectively, are each of substantially the same size. Likewise, the capacitor 212 in the integrating stage 201 and the corresponding capacitors 312, 412, 512 in the integrating stages 203, 205, 207, respectively, are each of substantially the same size and value. Table 2 below sets forth the nominal sizes and values of the various components of the integrating stages 201, 203, 205, 207.

TABLE 2

| Component(s) Number | Approximate Size/Value |
| --- | --- |
| 202, 232 | w = 7 µm, l = 0.35 µm |
| 302, 332 | |
| 402, 432 | |
| 502, 532 | |
| 204, 234 | w = 3 µm, l = 0.35 µm |
| 304, 334 | |
| 404, 434 | |
| 504, 534 | |

TABLE 2-continued

| Component(s) Number | Approximate Size/Value |
|---|---|
| 244, 344, 444, 544 | w = 10 µm, l = 16 µm |
| 212, 312, 412, 512 | 0.136 fF |
| 240, 340, 440, 540 | 0.272 fF |
| 230, 330, 430, 530 | p-device: w = 2 µm, l = 0.35 µm<br>n-device: w = 1 µm, l = 0.35 µm |
| 260, 360, 460, 560 | p-device: w = 7 µm, l = 0.35 µm<br>n-device: w = 3 µm, l = 0.35 µm |
| 210 | 415.8 K ohms |
| 310 | 399.6 K ohms |
| 410 | 289.8 K ohms |
| 510 | 273.6 K ohms |

However, the size and value of the resistor used in each of the integrating stages 201, 203, 205, 207 varies. That is, the resistor 210 in the integrating stage 201 and the corresponding resistors 310, 410, 510 in the integrating stages 203, 205, 207, respectively, are each of different sizes and values. Table 2 sets forth the approximate sizes and values of the resistors in the integrating stages 201, 203, 205, 207 for one illustrative embodiment of the present invention. The different resistive values yield different RC time constants in each integrating stage. For example, the resistor 210/capacitor 212 combination in the integrating stage 201 will have an RC time constant that differs from the resistor 310/capacitor 312 combination in the integrating stage 203. Consequently, the integrating stage 201 will have a longer delay between its input and its output than the integrating stage 203. Likewise, the resistor 410/capacitor 412 combination in the integrating stage 205 will have an RC time constant that differs from the resistor 510/capacitor 512 combination in the integrating stage 207, from the resistor 310/capacitor 312 combination, and from the resistor 210/capacitor 212 combination. The integrating stage 203 will have a longer delay between its input and its output than the integrating stage 205, and the integrating stage 205 will have a longer delay than the integrating stage 207. Thus, in one embodiment, the four integrating stages 201, 203, 205, 207 will have progressively shorter time delays between input and output, with the integrating stage 201 having the longest of the four delays and the integrating stage 207 having the shortest. The magnitude of the difference in delay from one stage to another need not be the same in all cases.

The selection circuit 200 may be fabricated on the same integrated circuit chip as the output buffer 100 such that any variation due to feature size, process variation or other manufacturing artifact will affect the selection circuit 200 and the output buffer 100 in approximately the same manner and to approximately the same extent. In one specific implementation of the output buffer 100 and the selection circuit 200 on the same integrated circuit chip, a known clock circuit (not shown) has been utilized in conjunction with the selection circuit 200 to aid in selecting appropriate values for the resistors 118 and 138 in the output buffer 100 (see FIG. 1) such that the slew rate of a signal on the node 154 (FIG. 1) will be within certain specified limits.

In one embodiment, by applying a periodic signal of approximately 3.0 volts at the input terminal 222, the amount of delay introduced by each of the four integrating stages 201, 203, 205, 207 may be measured. For example, a periodic step voltage that varies between approximately zero volts and approximately 3 volts may be applied at the input terminal 222. A known clock circuit operating at a frequency of approximately 14.318 MHz may be used to supply the periodic step voltage, and the period of the known clock circuit (in this instance, approximately 70 ns) may be compared to the lengths of delays introduced by each of the integrating stages 201, 203, 205, 207. The particular integrating stage that introduces a delay most closely matched with the known clock period may be used to determine appropriate sizes for the resistors 118, 138 in the output circuit. As will be appreciated by a person of ordinary skill in the art having the benefit of this disclosure, because of variations in semiconductor manufacturing processes and/or operating conditions, different ones of the integrating stages 201, 203, 205, 207 will most closely match the 70 nanosecond clock period on different integrated circuit chips.

In the illustrative implementation, assuming for purposes of explanation that the integrating stage 203 in a particular integrated circuit chip introduces a delay most closely matching the known clock period, the sizes of the resistors 118, 138 in the output buffer 100 may be selected. In the event the longest delay (integrating stage 201, for example) is shorter than the known clock period, the integrating stage 201 will be used to select appropriate resistor sizes for the output buffer 100. In the event the shortest delay (integrating stage 207, for example) is longer than the known clock period, the integrating stage 207 will be used to select appropriate resistor sizes for the output buffer 100.

The number of integrating stages in the selection circuit 200 may be increased or decreased, depending on, among other things, the number of steps desired to control the output slew rate to a desired limit and/or the number of switch points the chip designer desires. In the illustrative selection circuit 200, two integrating stages define a "switch point" by providing a hysteresis, as discussed in more detail below. For example, the integrating stages 201, 203 define a first switch point, while the integrating stages 205, 207 define a second switch point. Any number of switch points may be defined to provide a granularity sufficient to achieve the desired output slew rate range. In alternative embodiments, the hysteresis may be achieved by other means or may be omitted.

Figure 3A:
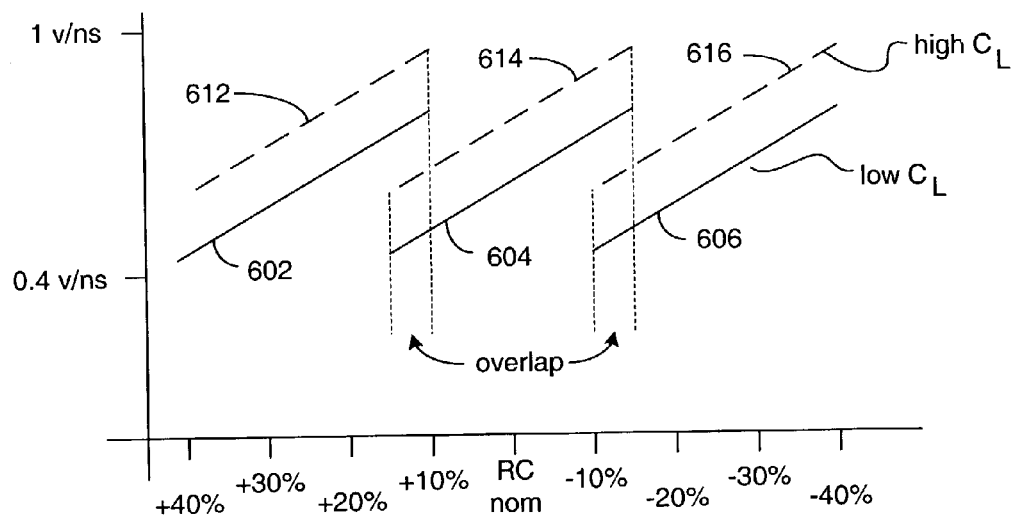
FIGS. 3A and 3B depict one illustrative set of curves used in selecting an appropriate resistor size for the circuit of FIG. 1.

FIG. 3A illustrates integrator curves that correspond to the four integrating stages 201, 203, 205, 207 of the illustrated selection circuit 200. As can be seen, each curve shows the variation of the slew rate for each value of RC and for "high" (40 pf) and "low" (15 pf) values of the capacitive load 106. That is, curves 602, 604 and 606 illustrate the variation of the output slew rate (from approximately 0.4 volts/ns to approximately 0.8 volts/ns) for three ranges of the RC constant where the capacitive load 106 is approximately 15 pf. Curve 602 represents an RC time constant range of about +10% to about +40% of "RC nom," curve 604 represents an RC time constant range of about +15% to about −15% of "RC nom," and curve 606 represents an RC time constant range of about −10% to about −40% of "RC nom." The curves 612, 614, 616 illustrate the variation of the output slew rate (from approximately 0.6 volts/ns to approximately 1.0 volts/ns) for the same three ranges of the RC time constant where the capacitive load 106 is approximately 40 pf. Thus, curve 612 represents an RC time constant range of about +10% to about +40% of "RC nom," curve 614 represents an RC time constant range of about +15% to about −15% of "RC nom," and curve 616 represents an RC time constant range of about −10% to about −40% of "RC nom." The curves 602, 604, 606 overlap slightly, as do the curves 612, 614, 616. The overlap may be used to create the aforementioned hysteresis, if so desired. In FIG. 3A, "RC nom" represents the value of RC at nominal process voltage and temperature.

Figure 3B:
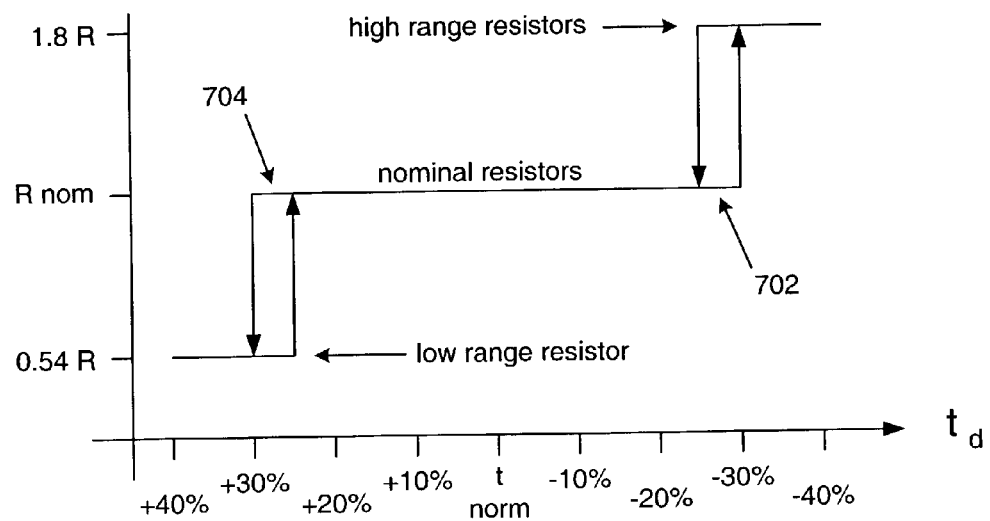

FIG. 3B graphically illustrates switch points 702, 704 that correspond to the illustrative selection circuit 200 of FIGS. 2A–2D. As seen, two switch points 702, 704 having hysteresis are defined, a first switch point 702 occurring at approximately −25% and −30% of "$t_{norm}$," and a second switch point 704 occurring at approximately +25% and +30% of "$t_{norm}$." Each switch point 702, 704 includes a range correlating to the overlap of the curves illustrated in FIG. 3A. The vertical axis of the graph of FIG. 3B depicts the value of the resistors 118, 138 of the output buffer 100 of FIG. 1. In the illustrative embodiment, the "$R_{nom}$," or nominal resistor value, may be approximately 1200 ohms. The value of "R" may be assigned a value of approximately 600 ohms at and below the first switch point, and it may be assigned a value of approximately 1800 ohms at and above the second switch point. From the curves depicted in FIG. 3A, it can be seen that these values of "R" will yield a value of RC that will provide the desired output slew rate over the specified range of the capacitive load 106.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. An output buffer, comprising:
   a predriver circuit having first and second transistors, a first resistor coupled between the first and second transistors, and a first capacitor coupled in parallel with the first resistor; and
   an output circuit coupled to the predriver circuit, the output circuit having an input node and an output node, the output circuit including a second capacitor coupled between the input node and the output node,
   the first resistor selected to provide a controlled signal slew rate at the output node of the output circuit.

2. The output buffer of claim 1, wherein:
   the first transistor is coupled between a first power supply node and a first output node;
   the first resistor is coupled between the first output node and a first predriver circuit node; and
   the second transistor is coupled between the first predriver circuit node and a second power supply node.

3. The output buffer of claim 2, wherein the first resistor is selected to provide a controlled signal slew rate of approximately 0.4–1.0 volts per nanosecond at the output node of the output circuit.

4. An output buffer, comprising:
   a first predriver circuit having a first resistor, a first capacitor, and a first output node;
   a second predriver circuit having a second resistor, a second capacitor, and a second output node;
   a buffer input node coupled to the first and second predriver circuits;
   an output circuit having third and fourth capacitors, first and second input nodes and a third output node, the first and second input nodes coupled, respectively, to the first output node and the second output node.

5. The output buffer of claim 4, wherein:
   the first capacitor is coupled between the third output node and the first output node; and
   the second capacitor is coupled between the third output node and the second output node.

6. The output buffer of claim 4, wherein the first predriver circuit further comprises:
   a first transistor coupled between a first power supply node and the first output node, the first resistor coupled between the first output node and a first predriver circuit node; and
   a second transistor coupled between the first predriver circuit node and a second power supply node.

7. The output buffer of claim 6, wherein the second predriver circuit further comprises:
   a first transistor coupled between the first power supply node and a circuit node of the second predriver circuit;
   the second resistor coupled between the second output node and the circuit node of the second predriver circuit; and
   a second transistor coupled between the second output node and the second power supply node.

8. The output buffer of claim 4, wherein the first and second resistors provide a signal slew rate of approximately 0.4–1.0 volts per nanosecond at the third output node.

9. An output buffer, comprising:
   a predriver circuit having first and second transistors and a first RC circuit, the first RC circuit coupled between the first and second transistors; and
   an output circuit coupled to the predriver circuit, the output circuit having an input node and an output node, the output circuit including a capacitor coupled between the input node and the output node,
   the first RC circuit selected to provide a controlled signal slew rate at the output node of the output circuit.

10. The output buffer of claim 9, wherein:
    the first transistor is coupled between a first power supply node and a first predriver circuit output node;
    the first RC circuit is coupled between the first predriver circuit output node and a first predriver circuit node, the first RC circuit comprising a resistor and a capacitor coupled in electrical parallel; and
    a second transistor is coupled between the first predriver circuit node and a second power supply node.

11. The output buffer of claim 9, wherein the first RC circuit is selected to provide a controlled signal slew rate of approximately 0.4–1.0 volts per nanosecond at the output node of the output circuit.

12. An output buffer, comprising:
    a first predriver circuit having a first RC circuit and having a first output node;
    a second predriver circuit having a second RC circuit and having a second output node;
    a buffer input node coupled to the first and second predriver circuits;
    an output circuit having first and second input nodes and a third output node, the first and second input nodes coupled, respectively, to the first output node and the second output node.

13. The output buffer of claim 12, wherein the output circuit further comprises:
    a first capacitor coupled between the third output node and the first output node; and
    a second capacitor coupled between the third output node and the second output node.

14. The output buffer of claim 12, wherein the first predriver circuit further comprises:
- a first transistor coupled between a first power supply node and the first output node, the first RC circuit coupled between the first output node and a first predriver circuit node, the first RC circuit comprising a resistor and a capacitor coupled in electrical parallel; and
- a second transistor coupled between the first predriver circuit node and a second power supply node.

15. The output buffer of claim 14, wherein the second predriver circuit further comprises:
- a first transistor coupled between the first power supply node and a circuit node of the second predriver circuit, the second RC circuit coupled between a second output node and the circuit node of the second predriver circuit, the second RC circuit comprising a resistor and a capacitor coupled in electrical parallel; and
- a second transistor coupled between the second output node and the second power supply node.

16. The output buffer of claim 12, wherein the first and second RC circuits provide a signal slew rate of approximately 0.4–1.0 volts per nanosecond at the third output node.

17. A system for providing an output buffer with a slew rate control, comprising:
- a predriver circuit having first and second transistors and a resistor coupled between the first and second transistors;
- an output circuit coupled to the predriver circuit, the output circuit having an input node and an output node, the output circuit including a capacitor coupled between the input node and the output node; and
- a selection circuit comprising a plurality of integrating stages having a corresponding plurality of delay times, the resistor being selected to provide a controlled signal slew rate at the output node of the output circuit using the plurality of delay times.

18. A system for providing an output buffer with a slew rate control, comprising:
- a predriver circuit having first and second transistors and an RC circuit coupled between the first and second transistors;
- an output circuit coupled to the predriver circuit, the output circuit having an input node and an output node, the output circuit including a capacitor coupled between the input node and the output node; and
- a selection circuit comprising a plurality of integrating stages having a corresponding plurality of delay times, the RC circuit being selected to provide a controlled signal slew rate at the output node of the output circuit using the plurality of delay times.

* * * * *